United States Patent
Heng et al.

(10) Patent No.: US 8,938,876 B2
(45) Date of Patent: Jan. 27, 2015

(54) METHOD OF MOUNTING A CIRCUIT BOARD

(75) Inventors: Stephen F. Heng, Los Gatos, CA (US); Mahesh S. Hardikar, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 74 days.

(21) Appl. No.: 13/311,956

(22) Filed: Dec. 6, 2011

(65) Prior Publication Data
US 2012/0083169 A1 Apr. 5, 2012

Related U.S. Application Data

(63) Continuation-in-part of application No. 12/774,780, filed on May 6, 2010, now Pat. No. 8,837,162.

(51) Int. Cl.
H01R 43/00 (2006.01)
H05K 7/10 (2006.01)

(52) U.S. Cl.
CPC .................................. *H05K 7/1084* (2013.01)
USPC .................. 29/825; 29/830; 29/832; 439/296

(58) Field of Classification Search
CPC ...... H01R 23/68; H01R 23/6806; H05K 7/10; H05K 7/1007
USPC ..................... 29/825, 830, 832, 840; 439/296
See application file for complete search history.

(56) References Cited

U.S. PATENT DOCUMENTS

| | | | |
|---|---|---|---|
| 4,918,513 A | 4/1990 | Kurose et al. | |
| 5,256,080 A | 10/1993 | Bright | |
| 6,011,304 A | 1/2000 | Mertol | |
| 6,340,309 B1 | 1/2002 | Lin et al. | |
| 6,537,096 B2 | 3/2003 | Szu et al. | |
| 6,654,250 B1 | 11/2003 | Alcoe | |
| 6,729,896 B2 | 5/2004 | Huang | |
| 6,743,026 B1 | 6/2004 | Brodsky | |
| 6,748,350 B2 | 6/2004 | Rumer et al. | |
| 6,749,443 B2 * | 6/2004 | Sano et al. | 439/71 |
| 6,848,172 B2 | 2/2005 | Fitzgerald et al. | |
| 6,848,610 B2 | 2/2005 | Liu | |
| 6,867,978 B2 | 3/2005 | Whittenburg et al. | |
| 6,870,258 B1 | 3/2005 | Too | |
| 6,882,535 B2 | 4/2005 | Labanok et al. | |
| 6,924,170 B2 | 8/2005 | Ravi et al. | |
| 6,934,154 B2 | 8/2005 | Prasher et al. | |

(Continued)

OTHER PUBLICATIONS

USPTO Office Action notification date Jun. 8, 2012; U.S. Appl. No. 12/774,780.

(Continued)

*Primary Examiner* — Carl Arbes
(74) *Attorney, Agent, or Firm* — Timothy M. Honeycutt

(57) ABSTRACT

Various circuit board sockets and methods of manufacturing and using the same are disclosed. In one aspect, a method of manufacturing is provided that includes forming a socket that is operable to receive a circuit board. The socket includes a surface for seating a first portion of a circuit board, a floor and a first support structure projecting away from the floor to support a second portion of the circuit board. The support structure includes a plurality of nested frames. In another aspect, a socket with a with socket cover coupled to a socket housing is disclosed. The socket housing includes a support structure to support a portion of the socket cover.

17 Claims, 12 Drawing Sheets

(56) References Cited

U.S. PATENT DOCUMENTS

| | | | |
|---|---|---|---|
| 6,936,501 | B1 | 8/2005 | Too et al. |
| 6,987,317 | B2 | 1/2006 | Pike |
| 6,989,586 | B2 | 1/2006 | Agraharam et al. |
| 7,009,289 | B2 | 3/2006 | Hu et al. |
| 7,012,011 | B2 | 3/2006 | Chrysler et al. |
| 7,014,093 | B2 | 3/2006 | Houle et al. |
| 7,015,073 | B2 | 3/2006 | Houle et al. |
| 7,344,919 | B2 | 3/2008 | McAllister et al. |
| 7,442,049 | B2 | 10/2008 | Hougham et al. |
| 7,544,542 | B2 | 6/2009 | Too et al. |
| 7,661,976 | B2 | 2/2010 | Ma |
| 7,666,016 | B2 * | 2/2010 | Kobayashi .................... 439/296 |
| 7,815,456 | B2 * | 10/2010 | Kunioka et al. ............... 439/331 |
| 2001/0036063 | A1 | 11/2001 | Nagaya et al. |
| 2001/0046795 | A1 * | 11/2001 | Ohshima et al. ................ 439/73 |
| 2002/0176229 | A1 | 11/2002 | Derian et al. |
| 2003/0214800 | A1 | 11/2003 | Dibene, II et al. |
| 2004/0005800 | A1 | 1/2004 | Hou |
| 2004/0009682 | A1 | 1/2004 | Suzuki et al. |
| 2004/0095693 | A1 * | 5/2004 | Shirai et al. ....................... 361/1 |
| 2007/0072450 | A1 | 3/2007 | McAllister et al. |
| 2007/0090849 | A1 | 4/2007 | Mayder |
| 2008/0188110 | A1 * | 8/2008 | Kobayashi .................... 439/296 |
| 2008/0227310 | A1 | 9/2008 | Too et al. |
| 2008/0261457 | A1 * | 10/2008 | Kobayashi .................... 439/683 |

OTHER PUBLICATIONS

USPTO Office Action notification date Aug. 7, 2013; U.S. Appl. No. 12/774,780.

U.S. Appl. No. 13/308,861, filed Dec. 1, 2011, Heng et al.

USPTO Notice of Allowance mailed Dec. 31, 2012; U.S. Appl. No. 13/308,861.

USPTO Office Action notification date Feb. 13, 2014; U.S. Appl. No. 12/774,780.

* cited by examiner

METHOD OF MOUNTING A CIRCUIT BOARD

This application is a continuation-in-part of application Ser. No. 12/774,780, filed May 6, 2010 now U.S. Pat. No. 8,837,162.

BACKGROUND OF THE INVENTION

1. Field of the Invention

This invention relates generally to semiconductor processing, and more particularly to sockets useful with, for example, circuit boards, and to methods of making and using the same.

2. Description of the Related Art

In various types of electronic systems, microprocessors and sometimes other types of integrated circuits are often connected to some form of larger printed circuit board, such as a motherboard, daughterboard or other type of a printed circuit board. In some cases, the integrated circuit is connected to the motherboard by direct soldering or other direct mounting techniques. In other cases, a socket is provided on the upper surface of the motherboard that is designed to receive the integrated circuit. For those integrated circuits that consist of some type of package enclosure and some plurality of conductor pins that project from the package, the motherboard socket includes a corresponding plurality of individual socket holes that are arranged spatially to match up with corresponding conductor pins on the integrated circuit package.

In one conventional socket design, the integrated circuit socket consists of a fortress-like structure that has four walls interconnected at four corners. The four walls enclose an interior space that has a bottom surface provided with a plurality of the aforementioned individual socket holes spatially arranged to receive respective conductor pins of the integrated circuit. When the integrated circuit package is seated in the socket, structural support for the integrated circuit package is provided by way of the four corners and the walls of the socket. The walls of the socket tend to be relatively narrow when compared to the length and width of the integrated circuit package. Consequently, the structural support for the integrated circuit package is largely confined to the four corners of the integrated circuit package as well as a narrow peripheral band at the edge of the integrated circuit package.

The lack of a centralized support structure for an integrated circuit package in a motherboard socket might not present a difficult problem for integrated circuits if the only downward loads associated with the integrated circuit package consisted of the weight of the package itself. However, conventional designs of integrated circuits frequently require the use of a heatsink of one form or another that is positioned and held tightly on the integrated circuit package by way of a clamping mechanism. The application of a downward clamping force on the integrated circuit package through the heatsink is resisted in the conventional design described herein by the narrow walls and corners of the socket. With little or no central support for the integrated circuit package, the application of the downward clamping force on the heatsink can result in moments acting upon the integrated circuit package substrate.

Conventional ceramic integrated circuit package substrates may have sufficient stiffness to resist the action of such moments. However, many currently-available integrated circuit packages utilize a so-called organic substrate, which consists of one or more laminated layers of polymer materials. Such polymeric substrates have greater flexibility than comparably sized ceramic substrates. Thus, an organic substrate may simply be too flexible to resist the moments associated with the heatsink clamping force. If an organic substrate undergoes excessive flexure, the central portion of the organic substrate may warp downward and produce a tensile loading and an attendant stretching of a thermal interface material interposed between the integrated circuit package lid and the enclosed integrated circuit. For those types of thermal interface materials that utilize a compliant matrix interspersed with aluminum spheres, the stretching can lead to dramatic increases in the spacing between individual aluminum spheres. As the spacing between aluminum spheres increases, the thermal conductivity of the thermal interface material may drop off and lead to temperature spiking in the integrated circuit. If the temperature spiking is severe enough, thermal shutdown may occur.

One conventional socket design does include four upwardly projecting pillars that project from the bottom surface of the socket cover to provide limited and spatially confined structural support for small areas of a microprocessor package. These pillar supports may be sufficient for specific die sizes. Another conventional design utilizes a so-called "tic tac toe" configuration. As the name implies, the tic-tac-toe configuration utilizes two sets of intersecting walls that form a tic-tac-toe pattern. The intersecting walls span the entirety of the socket floor, from one opposing wall of the socket to the other. Still another conventional design utilizes a centrally positioned mound that rises from the socket cover floor.

Conventional sockets of the type just described are often electrically and physically connected to an underlying circuit board by way of plural solder balls that are connected to corresponding contacts within the socket housing and to contact structures or pads on the circuit board. These ohmic connections are established by a reflow process that temporarily liquefies the solder balls. One pitfall of utilizing such solder structures that require a reflow is that the post reflow state of the socket housing may be warped upward slightly. Although this warpage may be relatively subtle, resulting in a height differential between the center and edge of the socket housing on the order of less than a millimeter or so, the warpage may be enough to present difficulties. One issue raised is the possibility that package designers must fabricate conductor pins with long enough lengths to compensate for the warped socket housing and still establish proper ohmic contact with the various contacts in the socket housing. Another issue is that the socket housing may not provide sufficient structural support for the central portion of the overlying socket cover and in turn the semiconductor chip package substrate that is seated thereon.

The present invention is directed to overcoming or reducing the effects of one or more of the foregoing disadvantages.

SUMMARY OF EMBODIMENTS OF THE INVENTION

In accordance with one aspect of an embodiment of the present invention, a method of mounting a circuit board is provided that includes placing the circuit board in a socket. The socket includes a surface for seating a first portion of the circuit board, a floor and a first support structure projecting away from the floor to support a second portion of the circuit board. The first support structure includes a first plurality of nested frames. The circuit board is secured to the socket.

In accordance with another aspect of an embodiment of the present invention, a method of manufacturing is provided that includes forming a socket that is operable to receive a circuit board. The socket includes a surface for seating a first portion of a circuit board, a floor and a first support structure projecting away from the floor to support a second portion of the circuit board. The support structure includes a first plurality of nested frames.

In accordance with another aspect of an embodiment of the present invention, a method of operating an electronic device is provided that includes placing a circuit board in a socket. The circuit board includes a semiconductor chip electrically connected to the socket. The socket is positioned in the electronic device and includes a surface for seating a first portion of the circuit board, a floor and a first support structure projecting away from the floor to support a second portion of the circuit board. The first support structure includes a first plurality of nested frames. Electronic operations are performed with the semiconductor chip.

In accordance with another aspect of an embodiment of the present invention, an apparatus is provided that includes a socket operable to receive a circuit board. The socket includes a surface for seating a first portion of the circuit board, a floor and a first support structure projecting away from the floor to support a second portion of the circuit board. The first support structure includes a first plurality of nested frames.

In accordance with another aspect of an embodiment of the present invention, a method of mounting a circuit board is provided that includes placing the circuit board in a socket. The socket includes a socket cover coupled to a socket housing. The socket housing has a first surface with plural cavities and a first support structure projecting away from the first surface and adapted to support a portion of the socket cover. The circuit board is secured to the socket.

In accordance with another aspect of an embodiment of the present invention, a method of manufacturing is provided that includes forming a socket operable to receive a circuit board. The socket includes a socket cover coupled to a socket housing. The socket housing has a first surface with plural cavities and a first support structure projecting away from the first surface and adapted to support a portion of the socket cover.

In accordance with another aspect of an embodiment of the present invention, a method of operating an electronic device is provided that includes placing a circuit board in a socket. The circuit board includes a semiconductor chip electrically connected to the socket. The socket is positioned in the electronic device and includes a socket cover coupled to a socket housing. The socket housing has a first surface with plural cavities and a first support structure projecting away from the first surface and adapted to support a portion of the socket cover. Electronic operations are performed with the semiconductor chip.

In accordance with another aspect of an embodiment of the present invention, an apparatus is provided that includes a socket operable to receive a circuit board. The socket includes a socket housing and a socket cover coupled to the socket housing. The socket housing has a first surface with plural cavities and a first support structure projecting away from the first surface and adapted to support a portion of the socket cover.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various sockets useful with, for example, circuit boards are disclosed. In one aspect, a socket is disclosed that is operable to be mounted on a circuit board and, in-turn, receive a semiconductor chip device, such as a semiconductor chip package. The socket includes a cover with an opening leading to a floor. The floor includes a support structure that projects away from the floor to support a portion of the semiconductor chip device. In one embodiment, the support structure includes plural nested frames. In another aspect, a socket with a socket cover coupled to a socket housing is disclosed. The socket housing includes a support structure to support a portion of the socket cover. Additional details will now be described.

Figure 1:
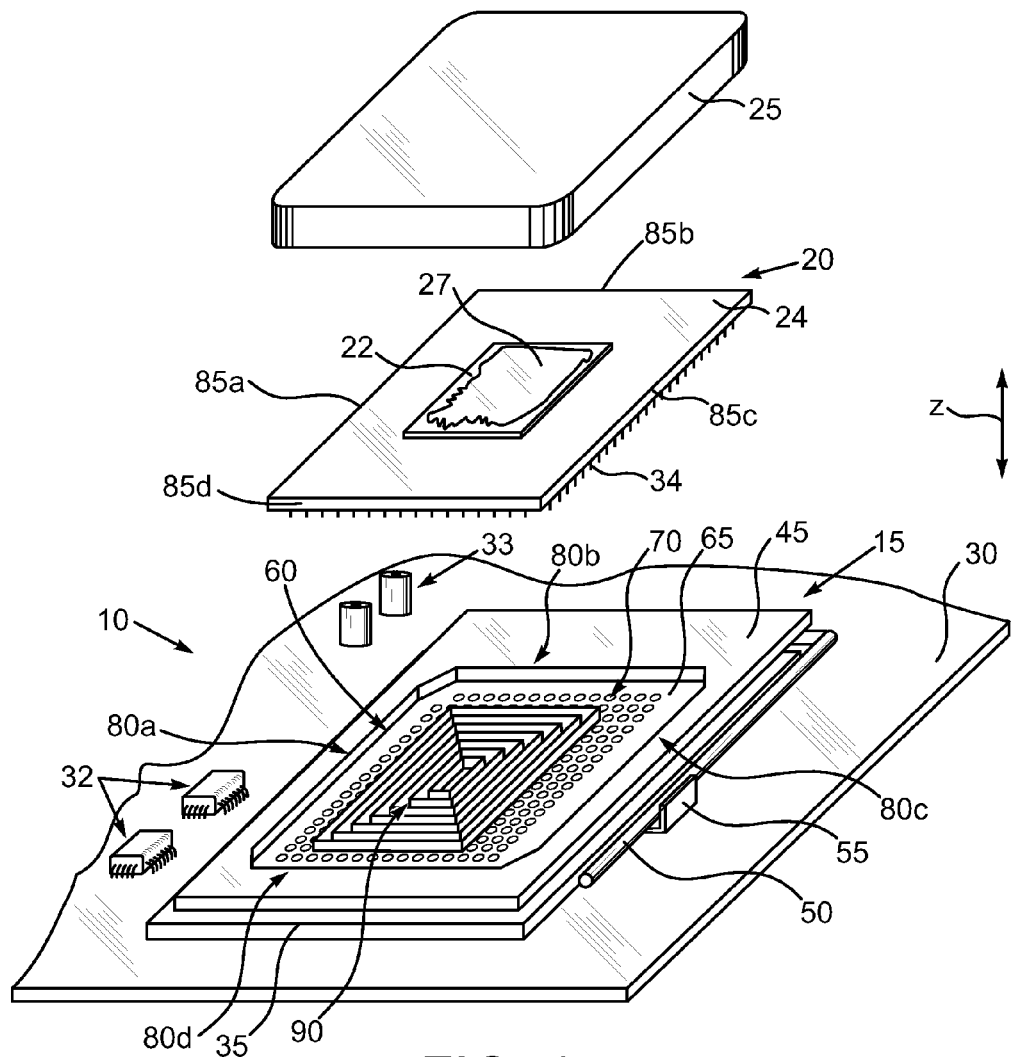
FIG. 1 is a pictorial view of an exemplary embodiment of a circuit board that includes a socket suitable to receive a semiconductor chip device.

In the drawings described below, reference numerals are generally repeated where identical elements appear in more than one figure. Turning now to the drawings, and in particular to FIG. 1 therein is depicted a pictorial view of an exemplary embodiment of a circuit board 10 that includes a socket 15 that is suitable to receive a semiconductor chip device 20, which is shown exploded. The semiconductor chip device 20 may include one or more semiconductor chips 22 mounted on a circuit board 24, and may be fitted with a suitable heat spreader or lid 25 as desired. The lid 25 is shown exploded from the circuit board 24. To facilitate heat transfer from the semiconductor chip 22 to the lid 25 a thermal interface material 27 may be applied to the semiconductor chip 22, to an underside of the lid 25 or both. The circuit board 10 includes a substrate 30 upon which the socket 15 and various other devices, such as semiconductor chip packages 32, passive devices 33, and may include other sockets (not shown) or any of the myriads of types of circuit elements that may be put on a circuit board.

The socket 15 may be used as an interface for a myriad of different types of circuit boards and semiconductor chips. For example, the circuit board 24 may be a semiconductor chip package substrate, a circuit card, a pinned socket adapter, or virtually any other type of printed circuit board. Although a monolithic structure could be used for the circuit board 24, a more typical configuration will utilize a build-up design. In this regard, the circuit board 24 may consist of a central core upon which one or more build-up layers are formed and below which an additional one or more build-up layers are formed. The core itself may consist of a stack of one or more layers. If implemented as a semiconductor chip package substrate, the number of layers in the circuit board 24 can vary from four to sixteen or more, although less than four may be used. So-called "coreless" designs may be used as well. The layers of the circuit board 24 may consist of an insulating material, such as various well-known epoxies, interspersed with metal interconnects. A multi-layer configuration other than buildup could be used. Optionally, the circuit board 24 may be composed of well-known ceramics or other materials suitable for package substrates or other printed circuit boards. The circuit board 24 may be provided with a number of conductor traces and vias and other structures (not visible) in order to provide power, ground and signals transfers between the semiconductor chip 22 and another device, such as the socket 15 for example. In this illustrative embodiment, the circuit board 24 includes conductor pins 34 connected to the latent traces and vias.

The semiconductor chip 22 may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The semiconductor chip 22 may be constructed of bulk semiconductor, such as silicon or germanium, or semiconductor-on-insulator materials, such as silicon-on-insulator materials.

The circuit board substrate 30 may be a motherboard, a circuit card, a semiconductor chip package substrate or virtually any other type of printed circuit board. Structurally speaking, the circuit board substrate 30 may use the same types of structures and materials as the circuit board 24.

The optional lid 25 may be a bath tub design as depicted, a top hat design or some other configuration as desired. The lid 25 may be composed of well-known ceramics or metallic materials as desired. Some exemplary materials include nickel plated copper, anodized aluminum, aluminum-silicon-carbon, aluminum nitride, boron nitride or the like. The lid 25 may be secured to the substrate 24 by an adhesive composed of a well-known thixotropic adhesive, an epoxy, another type of polymer or even a solder.

In this illustrative embodiment, the socket 15 is a pin grid type socket that includes a housing 35 mounted on the substrate 30 and a socket cover 45 that is slidedly mounted on the socket housing 35. The sliding movement of the socket cover 45 relative to the socket housing 35 is facilitated by a swingable lever arm 50 that is connected to a cam or other type of mechanism (not shown) suitable to provide sliding movement of the cover 45 relative to the housing 35. Here, the lever 50 is shown in a locked down position and restrained laterally by way of a retaining latch 55 that may be attached to the socket housing 35. The socket cover 45 is provided with an internal opening 60 that terminates vertically in a floor 65. The floor 65 is provided with a plurality of socket holes 70, which are designed to receive corresponding pins 34 of the circuit board 24. As described more fully below, the socket holes 70 lead through the socket cover 45 and provide access for the pins 34 to conducting structures (not visible) that are mounted in the socket housing 35. The upper surface of the socket cover 45, and in particular the portions 80a, 80b, 80c and 80d, provides a seating surface to support the edges 85a, 85b, 85c and 85d of the circuit board 24 of the semiconductor chip device 20.

The circuit board 20 may be subjected to significant stresses in the z-axis direction. These may be caused by various mechanisms, such as temperature induced warping of the substrate 24 and forces transmitted down by the lid 25 when a heat sink (not shown) is tightly clamped down on the lid 25. If the portion of the substrate 24 that supports the semiconductor chip 22 is not, in-turn, sufficiently supported, then large z-axis strains could harm the semiconductor chip 22 or cause undesired stretching of the thermal interface material 27. To provide the desired support, the socket cover 45 is provided with a support structure 90, which in this illustrative embodiment, may consist of a plurality of nested frames. As depicted in more detail in FIG. 3, the support structure 90 advantageously has a vertical dimension along a z-axis that is just slightly higher than the distance along the same axis from the floor 65 to the support surfaces 80a, 80b, 80c and 80d. In this way, the central portion 98 of the semiconductor chip device 20, particularly in the vicinity of the semiconductor chip 22, is adequately supported when the semiconductor chip device 20 is seated in the socket cover 45.

Figure 2:
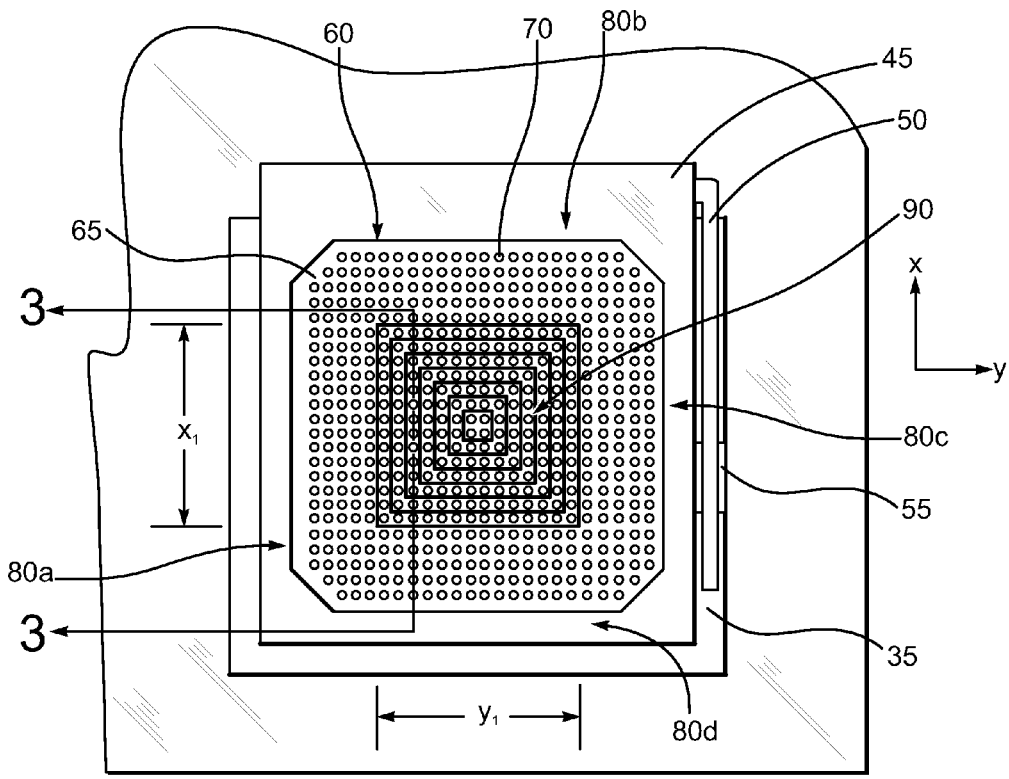
FIG. 2 is a plan view of the exemplary circuit board depicted in FIG. 1.

Additional details of the circuit board 10 and the socket 15 may be understood by referring now to FIG. 2, which is a plan view of the circuit board 10 and the socket 15 but without the semiconductor chip device 20 or the lid 25 depicted in FIG. 1 in place. Here, the socket housing 35, the socket cover 45, the lever arm 50 and the retaining latch 55 are clearly visible. In this illustrative embodiment, the opening 60 of the socket cover 45 may be generally octagonal as shown. However, the skilled artisan will appreciate that many other shapes may be used. In this illustrative embodiment, the support structure 90 may consist of seven nested frames that are sized and shaped of decreasing footprint so that the space along either an x or y axis between two adjacent frames may be occupied by a single row of the socket holes 70. However, the skilled artisan will appreciate that the number of frames may be other than seven and the spacing between adjacent frames may be such that multiple socket holes may be straddled therebetween. The support structure 90 in this illustrative embodiment has a rectangular footprint that may be defined by the dimensions $x_1$ and $y_1$. A technical goal of the embodiments disclosed herein is to provide the support structure 90 with a footprint defined perhaps by the dimensions $x_1$ and $y_1$ that corresponds roughly to the footprint of the semiconductor chip 22 of the semiconductor chip device 20 depicted in FIG. 1. However, shapes other than rectangular are envisioned and the nested frames need not be concentric. Furthermore, and as shown in a subsequent illustrative embodiment, multiple support structures may be provided in order to support multiple areas of a seated circuit board, which may be useful in circumstances where a semiconductor chip device includes multiple chips separated laterally on a carrier substrate or for other types of devices that would require vertical support. In this illustrative embodiment, the pitch along the x-axis and the y-axis between adjacent of the socket holes 70 is relatively constant. However, the skilled artisan will appreciate that the arrangement of socket holes 70 may be nonuniform in that a variety of different pitches may be used and entire areas of the floor 65 of the socket cover 45 may be devoid of socket holes 70 as desired.

The socket housing 35 and the socket cover 45 may be composed of a variety of electrically insulating materials, such as liquid crystal polymer, fiberglass resin materials, well-known plastics or the like. The support structure 90 is advantageously composed of the same materials used to fabricate the socket cover 45 and in this way may be fabricated by molding or otherwise at the same time as the socket cover 45. Optionally, the support structure 90 could be separately fabricated from the same or another type of insulating material and thereafter secured to the floor 65 of the socket cover 45 by adhesives or other fastening techniques.

Figure 3:
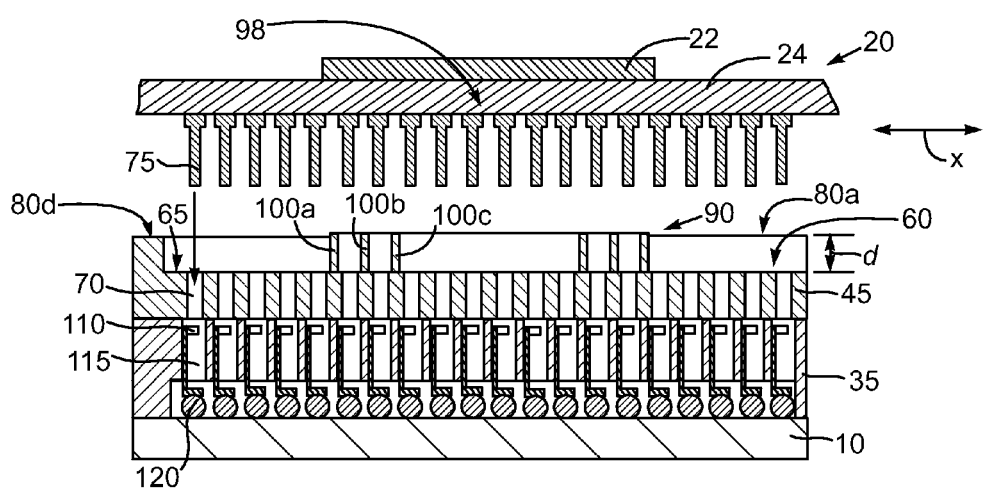
FIG. 3 is a sectional view of FIG. 2 taken at section 3-3.

Still further details of the socket cover 45 may be understood by referring now to FIG. 3, which is a sectional view of FIG. 2 taken at section 3-3. Note that section 3-3 passes through three of the nested frames of the support structure 90 as well as several of the socket holes 70 but only passes through a portion of the supporting surface 80d and does not encompass the entirety of the floor 65 of the socket cover 45. Here, the three visible nested frames of the support structure 90 are shown and labeled 100a, 100b and 100c, respectively. Note that the support structure 90 or at least some of the nested frames 100a, 100b and 100c, etc. thereof project slightly above the support surfaces 80d and 80a of the socket cover 45. This height differential between the support structure 90 and the support surfaces 80a, 80b, 80c and 80d of the socket cover 45 may take on a variety of values. In an exemplary embodiment, the depth d of the opening 60 may be about 0.3 mm and the height differential between the depth d and the amount that the support structure 90 projects above the support surfaces 80a, 80b, 80c and 80d may be about 0.05 mm. In this way, the support structure 90 can provide a supporting framework that has approximately the same footprint as the central portion of the circuit board 20 or at least the semiconductor chip 22 while still providing easy access for the pins 75. Still referring to FIG. 3, when the circuit board 24 of the semiconductor chip device 20 is seated in the socket cover 45, the pins 75 project downward into corresponding of the socket holes 70. After seating, the pins 75 project into the holes 70 and the socket cover 45 is moved along the x-axis relative to the socket housing 35 in order to bring the pins 75 into engagement with corresponding conductor terminals 110 that are positioned in respective spaces 115 in the socket housing 35. The terminals 110 may be connected to corresponding solder balls 120 or other conductor structures that connect the socket housing 35 to the circuit board 10. The skilled artisan will appreciate that the types of conductor structures used to make contact with the pins 75 as well as the circuit board 10 may take on a huge variety of different configurations.

Figure 4:
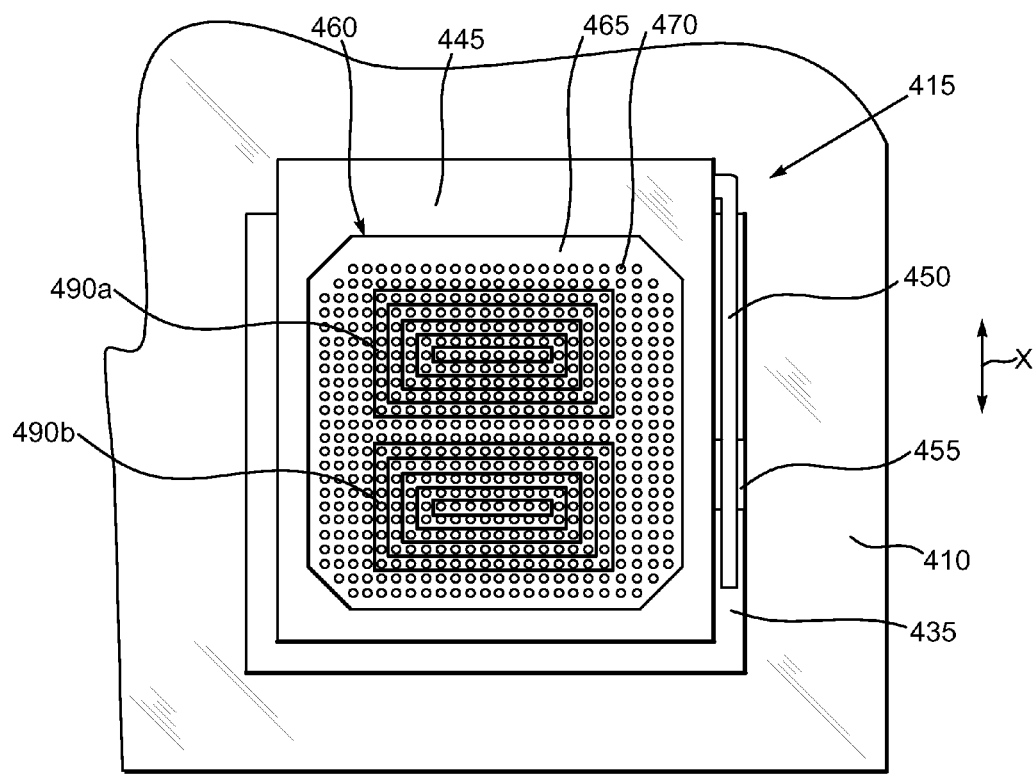
FIG. 4 is a plan view like FIG. 2, but of an alternate exemplary circuit board and socket.

An alternate exemplary embodiment of a socket 415 that may be used with a circuit board 410 may be understood by referring now to FIG. 4, which is a plan view like FIG. 2. In this illustrative embodiment, the socket 415 may include a socket housing 435 that supports a socket cover 445. Like the other embodiments disclosed herein, the socket cover 445 may be movable along an x-axis relative to the socket housing 435 by way of a cam or other mechanism (not visible) operated by the depicted lever 450 that may seat in a retaining latch 455 as desired and described elsewhere herein. Of course, other types of mechanisms may be used to establish the requisite relative movement between the socket cover 445 and the socket housing 435. Furthermore, as is the case for any of the disclosed embodiments, there need not be any relative motion between the socket cover 445 and the socket housing 435, particularly if such movement is not required in order to establish contact between whatever interconnects are used for the circuit board that seats in the socket 415 and the mating conductor structures in the socket housing 435. Here, the socket cover 445 includes an opening 460 that leads to a floor 465 populated by socket holes 470 that may be arranged as described elsewhere herein. However, in this illustrative embodiment, two support structures 490a and 490b may be provided on the floor 465 in order to support multiple portions of a circuit board or other structure that is seated in the socket cover 445. As noted elsewhere herein, this arrangement may be useful in circumstances where the circuit board to be seated in the socket cover 445 includes two spaced-apart semiconductor chips each requiring separate supporting elements or some other configuration that calls for separate and discrete supporting elements. Again, the number of nested frames that make up the support structures 490a and 490b as well as their geometries are subject to great variety.

Figure 5:
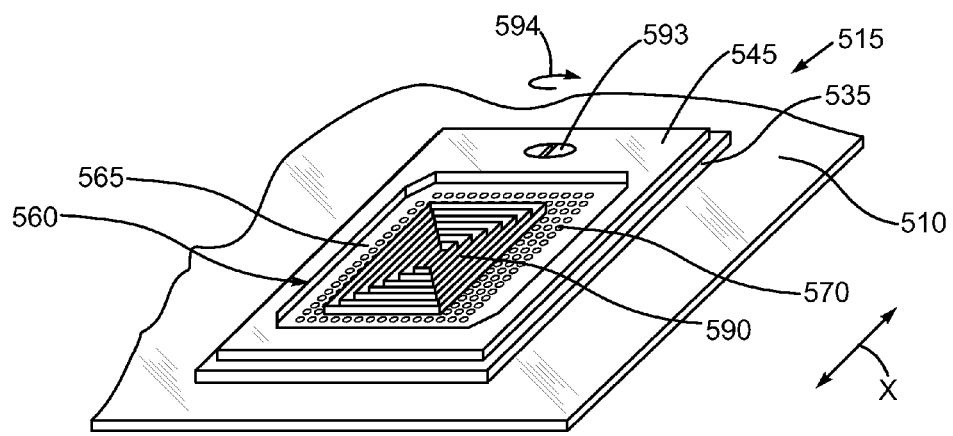
FIG. 5 is a pictorial view of another alternate exemplary circuit board with a socket suitable to receive a semiconductor chip device.

In the foregoing illustrative embodiments, the relative movement between a socket cover and a socket housing is facilitated by a cam mechanism that is actuated by way of a lever, such as the lever 50 depicted in FIGS. 1 and 2 and the lever 450 depicted in FIG. 4. However, the skilled artisan will appreciate that other mechanisms may be used to actuate a cam or other mechanism to facilitate sliding movement between two cooperating elements. In this regard, attention is now turned to FIG. 5, which is a pictorial view of a circuit board 510 that includes a socket 515 that may be configured as generally described elsewhere herein and depicted in FIGS. 1-4. In this regard, the socket 515 may include a socket housing 535 and a socket cover 545 is slidedly mounted thereon. The socket cover 545 may include an opening 560 that leads to a socket floor 565 populated with plural socket holes 570, and a support structure 590. However, in order to facilitate the sliding movement, a screw head 593 may be secured to a cam mechanism (not shown) beneath the visible surface of the socket cover 545. By turning the screw head 593 as suggested by the arrow 594, the socket cover 545 may be moved along the x-axis relative the socket housing 535 in order to engage whatever interconnects that project downwardly from a circuit board (not shown) to be seated in the socket cover 545. Such a screw-activated mechanism may be suitable in circumstances where the electronic device in which the circuit board 510 is mounted is relatively small and lacks sufficient clearance for the positioning and movement of a lever arm or other larger type of device that requires greater freedom of movement in order to operate. Any of the disclosed embodiments may use this type of movement mechanism.

Figure 6:
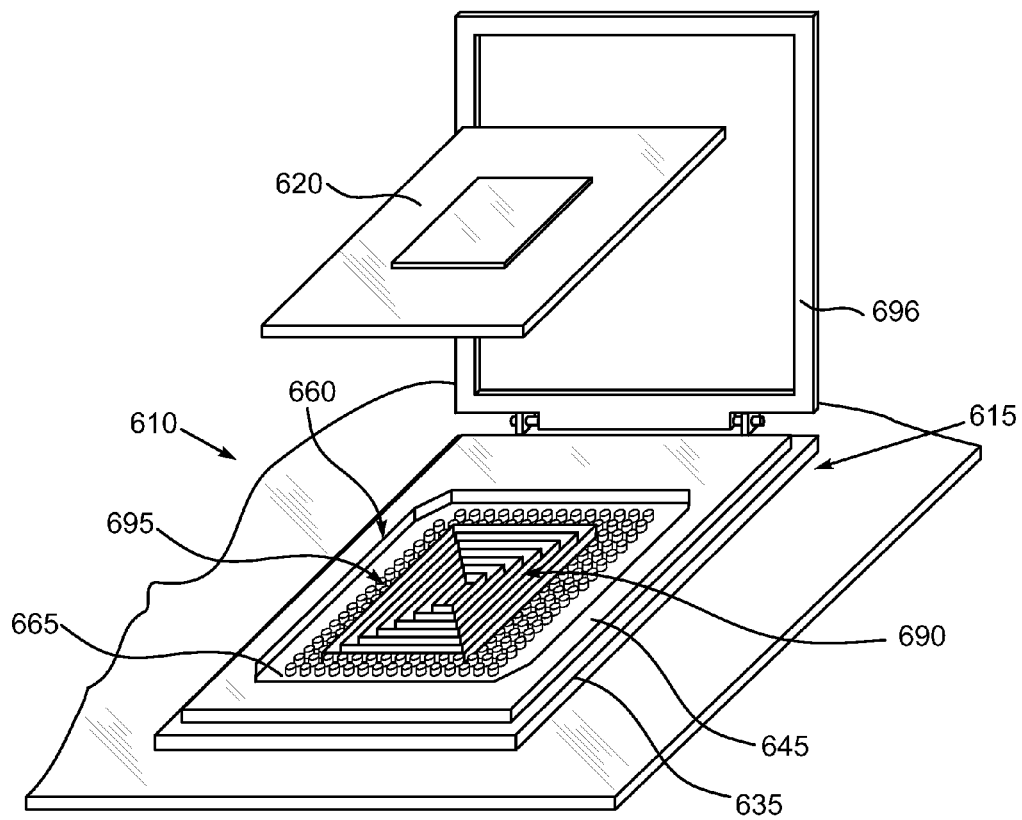
FIG. 6 is a pictorial view of another alternate exemplary circuit board with a socket suitable to receive a semiconductor chip device.

In the foregoing illustrative embodiments, the sockets 15, 415 and 515 are generally configured to receive a pin interconnect type of circuit board, such as a pin grid array circuit board. However, the skilled artisan will appreciate that the utilization of a frame-like support structure may be tailored for something other than a pin type socket. For example, a land grid array type of socket may be used. In this regard, attention is now turned to FIG. 6, which is a pictorial view of an alternate exemplary embodiment of a circuit board 610 that includes a socket 615 suitable to receive a semiconductor chip device 620 that may be configured like the semiconductor chip device 20, but with a land grid array for input/output. In this regard, the socket 615 may include a socket housing 635 and a socket cover 645 that is not movable relative to the socket housing 635. Indeed, the socket cover 645 could be formed integrally with the socket housing 635 as desired. The socket cover 645 includes an opening 660 that leads to a floor 665. The floor 665 may be populated by a land grid array 695 that consists of a plurality of compressible contacts that are conductive elements used to establish ohmic contact with a corresponding set of lands (not visible) of the semiconductor chip device 620. Here, a support structure, such as the support structure 690, may be interspersed among the lands of the array 695 and used to support the semiconductor chip device 620 as disclosed generally herein. However, some other type of mechanism may be used to secure the semiconductor chip device 620 to the socket cover 645. In this regard, and in this illustrative embodiment, a hinge operated clamping frame 696 may be used to secure the semiconductor chip device 620 to the socket cover 645 following seating thereon. The skilled artisan will appreciate that many different types of fastening mechanisms may be used other than the clamping frame 696 as desired. Of course, it should be appreciated that any of the disclosed embodiments of a socket 15, 415, 515 and 615, and those to be described, could use gravity alone to seat a circuit board thereon.

Figure 7:
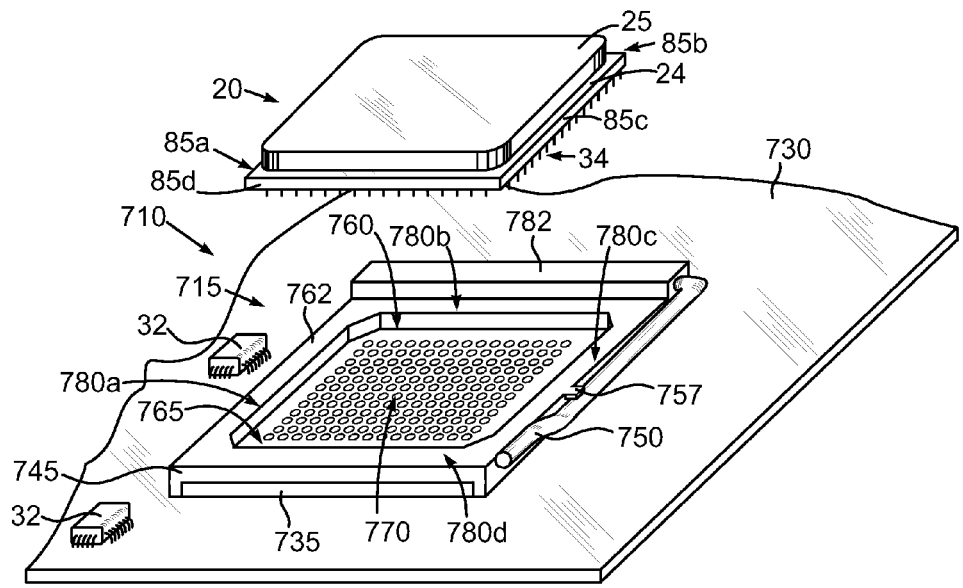
FIG. 7 is a pictorial view of another alternate exemplary circuit board with a socket suitable to receive a semiconductor chip device and with a socket housing support structure.

FIG. 7 is a pictorial view of an alternate exemplary embodiment of a circuit board 710 that includes a socket 715 suitable to receive the semiconductor chip device 20. Here the semiconductor chip device 20 is shown with the circuit board 24 and the lid 25 joined, but otherwise exploded from the socket 715 and with conductor pins 34 visible. The circuit board 710 includes the substrate 730 with the socket 715 and various other devices, such as semiconductor chip packages 32 and passive devices 33, mounted thereon and may include other sockets (not shown) or any of the myriads of types of circuit elements that may be put on a circuit board. The socket 715 may be a pin grid type socket that includes a housing 735 mounted on the substrate 730 of the circuit board 710 and a socket cover 745 that is slidedly mounted on the socket housing 735. The sliding movement of the socket cover 745 relative to the socket housing 735 is facilitated by a swingable lever arm 750 that is connected to a cam or other type of mechanism (not shown) suitable to provide sliding movement of the cover 745 relative to the housing 735. Here, the lever 750 is shown in a locked down position and restrained laterally by way of a retaining tab 757 that may be attached to the socket cover 745. Furthermore, as is the case for any of the disclosed embodiments, there need not be any relative motion between the socket cover 745 and the socket housing 735, particularly if such movement is not required in order to establish ohmic contact between whatever interconnects are used for the circuit board 24 that seats in the socket 715 and the mating conductor structures in the socket housing 735. The socket cover 745 is provided with an internal opening 760 that terminates vertically in a floor 765. The floor 765 is provided with a plurality of socket holes 770, which are designed to receive corresponding pins 34 of the circuit board 24. As described more fully below, the socket holes 770 lead through the socket cover 745 and provide access for the pins 34 to conducting structures (not visible) that are mounted in the socket housing 735. The upper surface 762 of the socket cover 745, and in particular the portions 780a, 780b, 780c and 780d, provides a seating surface to support the edges 85a, 85b, 85c and 85d of the circuit board 24 of the semiconductor chip device 20. The socket housing 735 and socket cover 745 may be substantially identical structurally to, for example, the socket depicted in FIG. 1 and described elsewhere herein. There may be a few structural differences such as the enlarged portion 782 of the socket cover 745 from which the lever arm 750 projects as well as the overhanging nature of the socket cover 745 relative to the socket housing 735. However, in terms of basic sliding functionality, the socket housing 735 and socket cover 745 function like the other embodiments disclosed herein.

Figure 8:
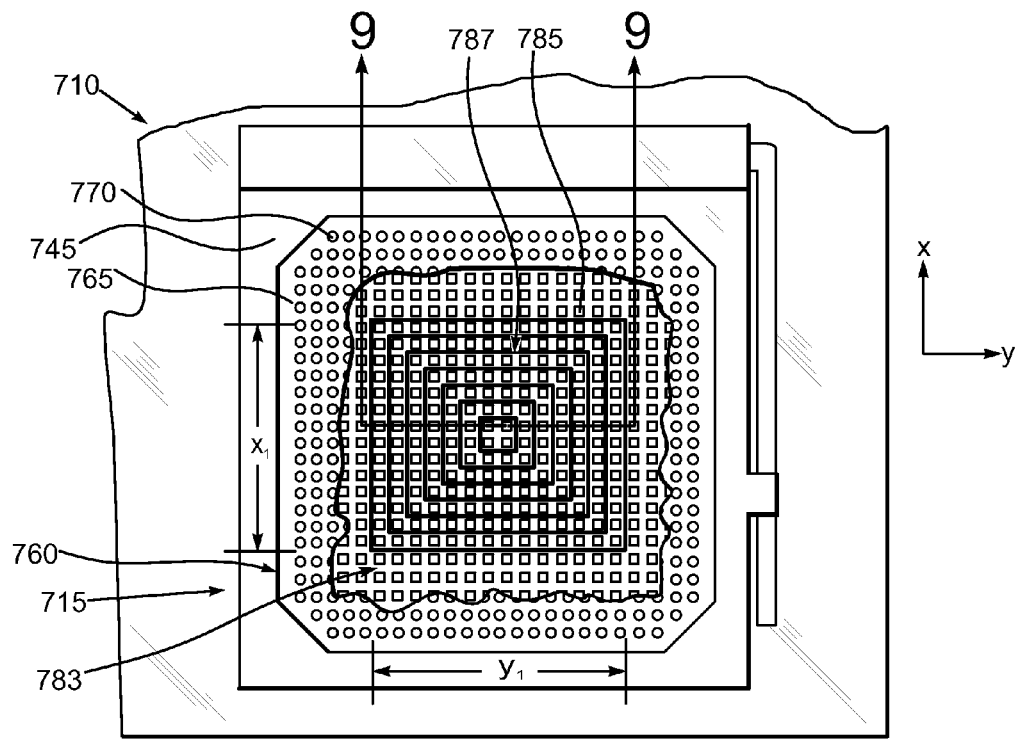
FIG. 8 is a plan view of the alternate exemplary socket of FIG. 7.

Additional details of the socket may be understood by referring now also to FIG. 8, which is an enlarged overhead view of the socket depicted in FIG. 7 but with a central portion of the floor 765 of the socket cover 745 cut away to reveal a portion of an upper surface 783 of the socket housing 735. Note of course that the upper surface 783 of the socket housing 735 includes plural cavities 785 that are somewhat aligned vertically with the pin holes 770 of the socket cover 745. Note also that in this alternate embodiment, a support structure 787 is provided on the upper surface 783 of the socket housing 735 that is designed to provide support for the socket cover 745 following a solder reflow process to mount the socket 715 to the circuit board 710. Here, the support structure 787 has the same general configuration as the support structure 90 projecting upward from the socket cover 45 depicted in FIGS. 1 and 2. Thus, a plurality of nested frames may be used that project upwardly out of the page. In this illustrative embodiment, the opening 760 of the socket cover 745 may be generally octagonal as shown. However, the skilled artisan will appreciate that many other shapes may be used. In this illustrative embodiment, the support structure 787 may consist of seven nested frames that are sized and shaped of decreasing footprint so that the space along either an x or y axis between two adjacent frames may be occupied by a single row of the cavities 785. However, the skilled artisan will appreciate that the number of frames may be other than seven and the spacing between adjacent frames may be such that multiple socket holes may be straddled therebetween. The support structure 787 in this illustrative embodiment has a rectangular footprint that may be defined by the dimensions $x_1$ and $y_1$.

Figure 9:
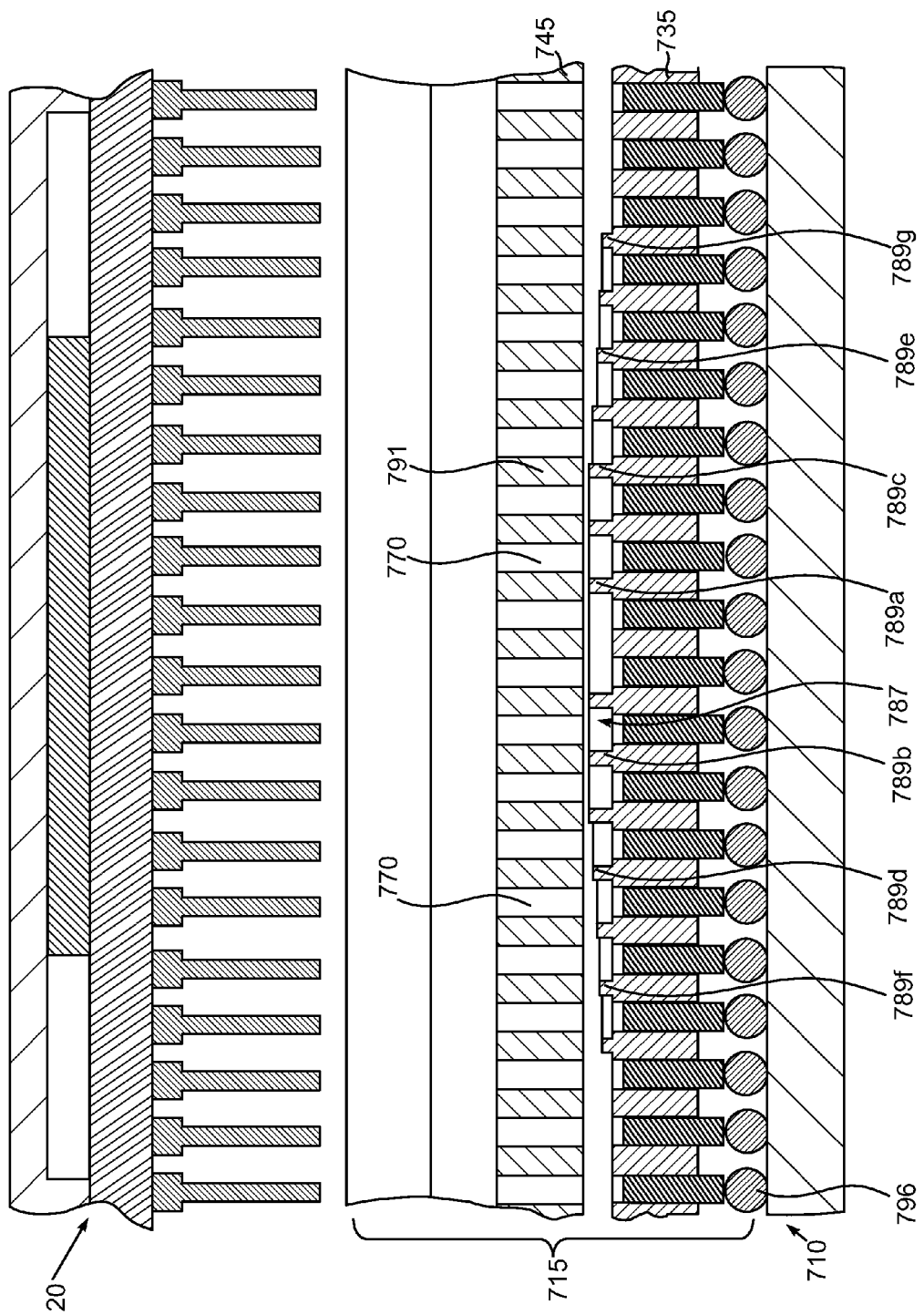
FIG. 9 is a sectional view of FIG. 8 taken at section 9-9.

Still more details of the socket 710 may be understood by referring now also to FIG. 9, which is an enlarged sectional view of FIG. 8 taken at section 9-9. Note that section 9-9 passes through the support structure 787 but only through portions of the socket cover 745 and the socket housing 735. Note also that FIG. 9 will not depict the cut away of the socket cover 745 depicted in FIG. 8 but will depict the semiconductor chip device 20 exploded from the socket 715. The support structure 787 as noted above includes a plurality of nested frames 789a, 789b, 789c, 789d, 789e, 789f and 789g that are designed to bear against and support, if necessary, the socket cover 745, and particularly the spaces of the socket cover 745 between the pin holes 770. Note that the elevations of the frames 789a, 789b, 789c, 789d, 789e, 789f and 789g of the support structure 787 may be stratified in that the innermost frame 789a may have a higher elevation than the outermost frame 789g for example. Since a technical goal of the support structure 787 to provide a somewhat planar bearing surface for the socket cover 745 after the socket housing 735 has undergone an upward warpage during reflow of the solder balls 796, the outermost frame 789g will by definition be at a higher elevation due to the warpage than the innermost frame 789a and thus need not have the same free state elevation as depicted in FIG. 9.

Figure 10:
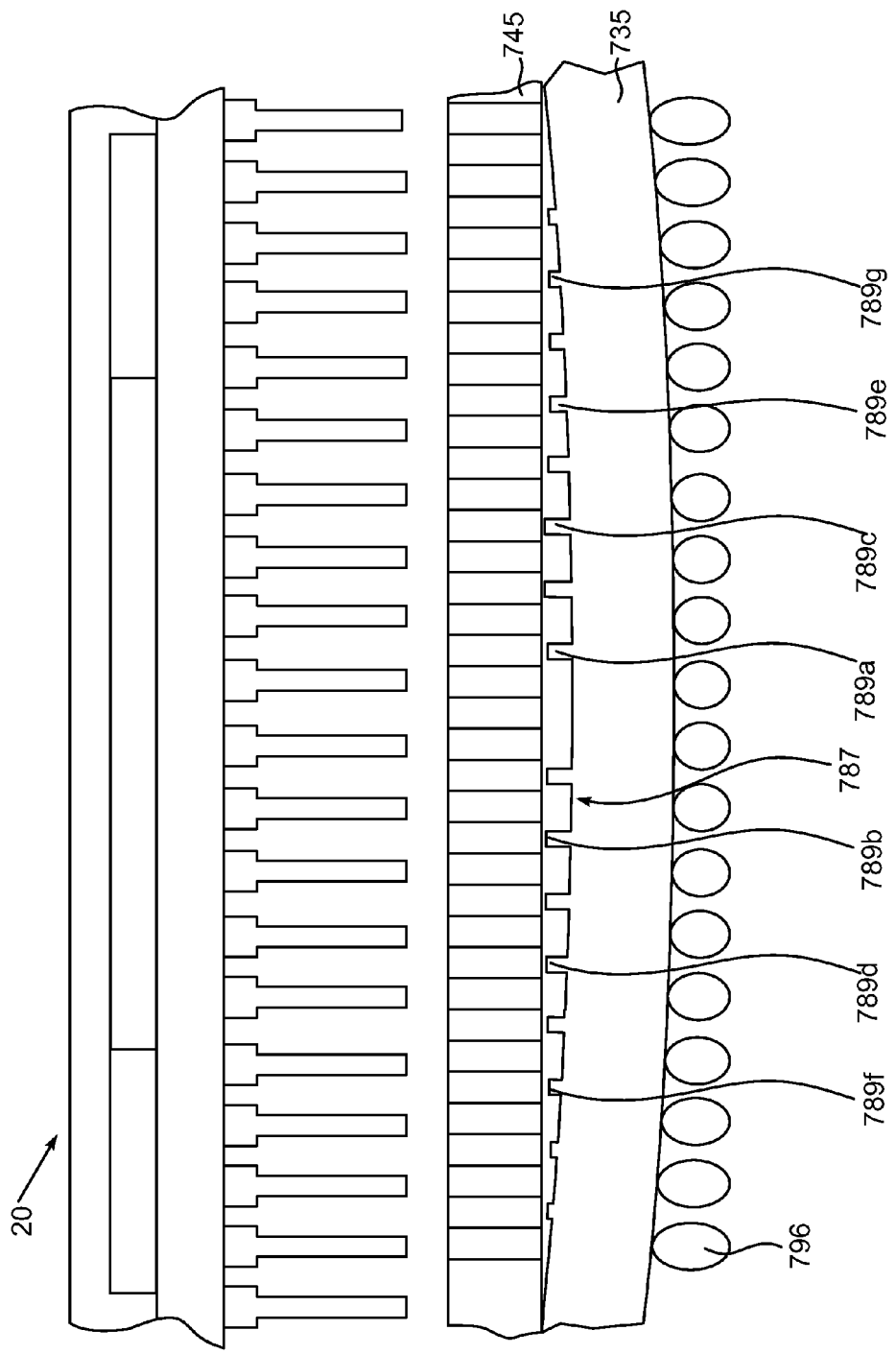
FIG. 10 is a simplified sectional view like FIG. 9, but without cross-hatching.

The supporting function of the support structure post solder reflow and thus in a warped state may be understood by referring now to FIG. 10, which is a simplified sectional view like FIG. 9 but without crosshatching or other features for simplicity of illustration. Here, the socket housing 735 is shown in a post solder reflow warped condition as clearly suggested by some of the stretched solder balls 796. Note that the amount of warpage is exaggerated for ease of visibility. Note also that the individual frames loops or shells are depicted in a simplified manner relative to FIG. 9. However, FIG. 10 shows that despite the upward warpage of the socket housing 735, the frames of the support structure 787 provides a somewhat planar support surface for the socket cover 745, which provides a better seating surface for the semiconductor device 20.

Figure 11:
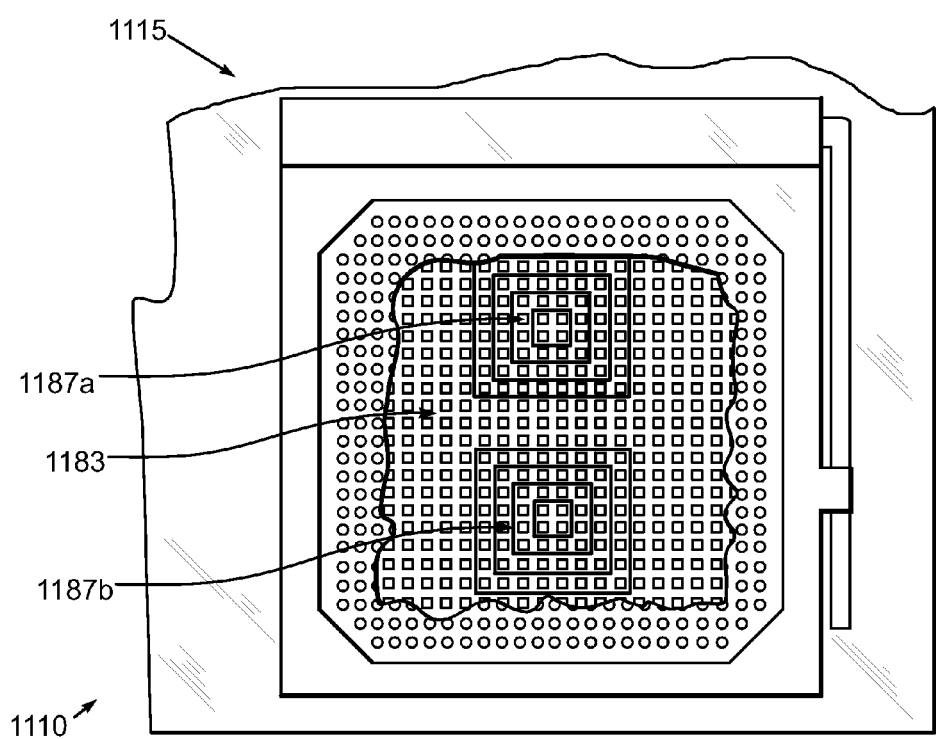
FIG. 11 is a plan view of another alternate exemplary circuit board with a socket suitable to receive a semiconductor chip device and with socket housing support structures.

Another alternate exemplary embodiment of a socket 1115 may be understood by referring now to FIG. 11, which is a plan view. Here, the socket 1115 may be mounted on a circuit board 1110 configured substantially identically like the socket 715 depicted in FIGS. 7, 8 and 9. However, the socket housing surface 1183 may include plural spaced-apart support structures 1187a and 1187b that may each be like the support structure 787 depicted in FIGS. 7, 8 and 9 but separated laterally as depicted. Such support structures 1187a and 1187b may number more than two and be arranged in a variety of ways on the socket housing surface 1183.

Figure 12:
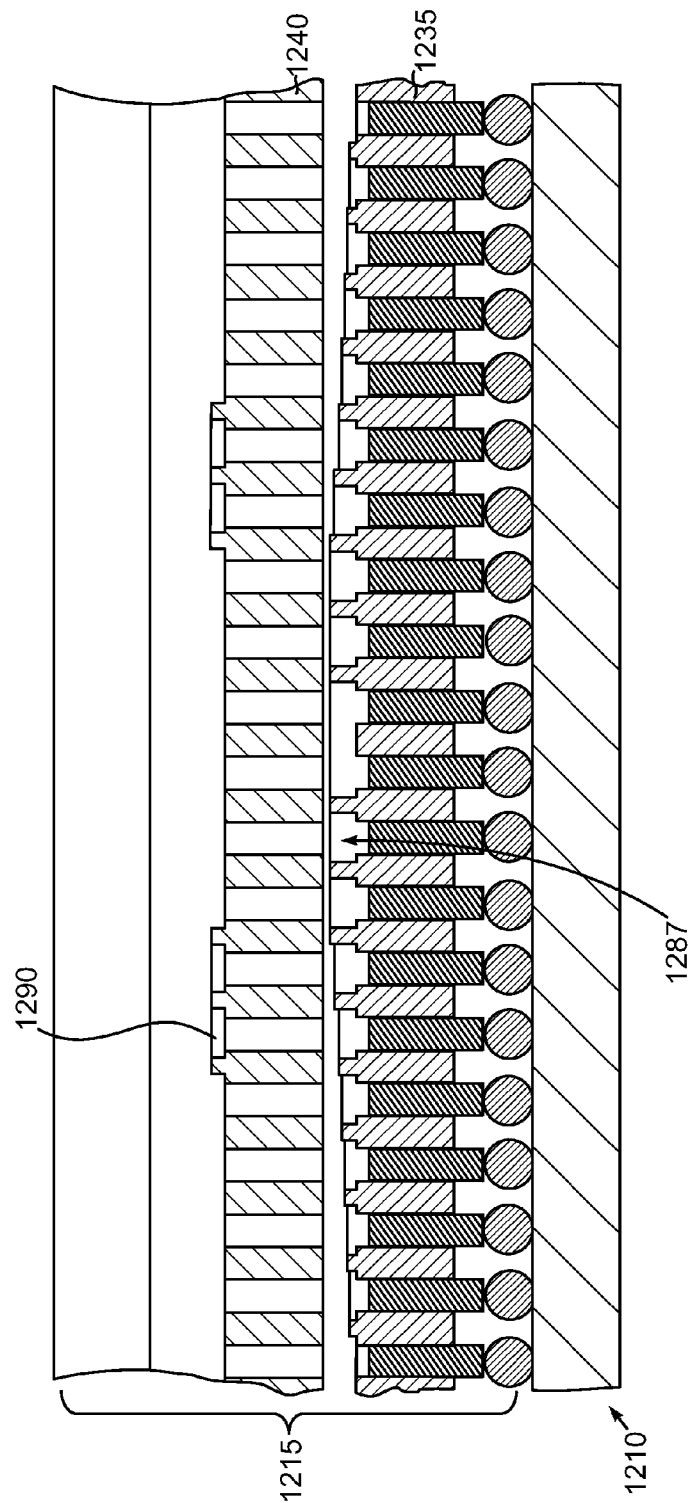
FIG. 12 is a sectional view like FIG. 9, but of another alternate exemplary circuit board with a socket suitable to receive a semiconductor chip device and with a socket housing support structure and a socket cover support structure.
Figure 13:
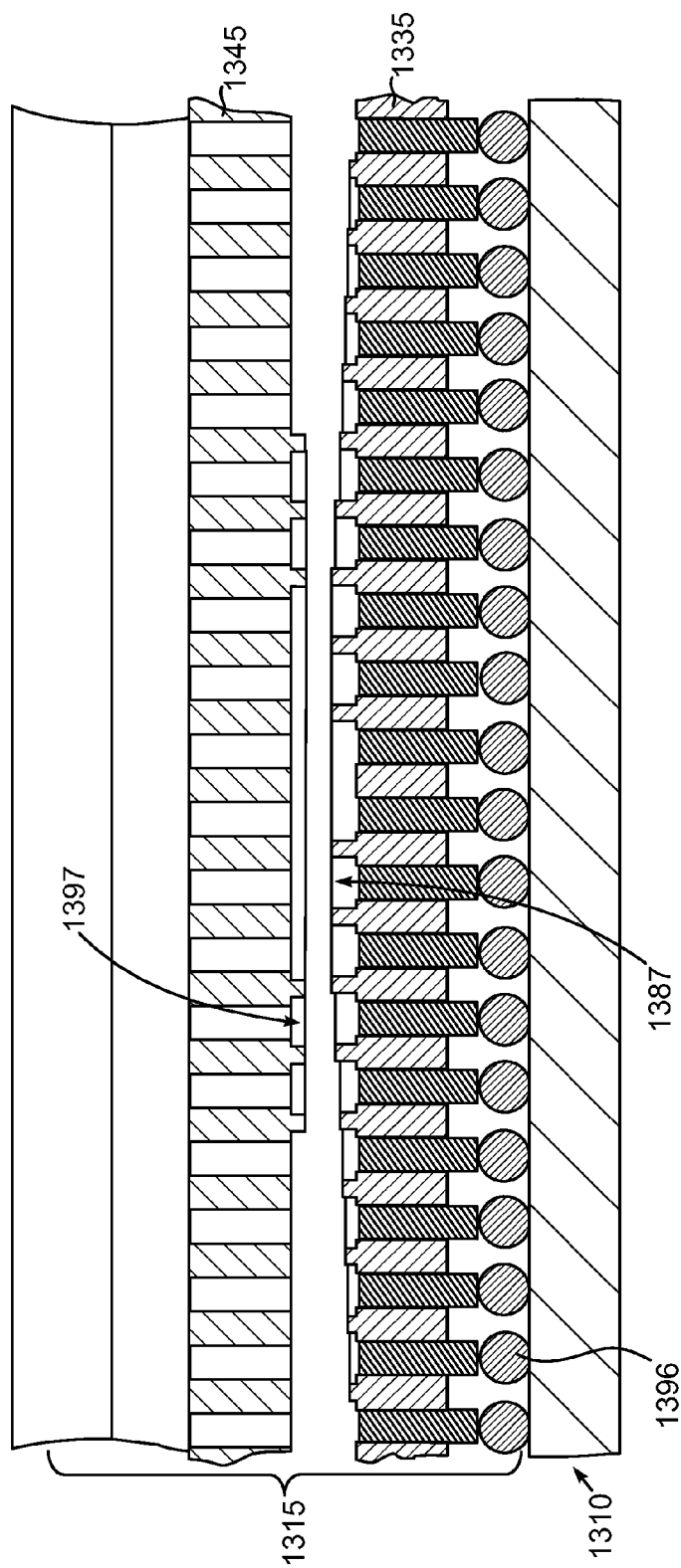
FIG. 13 is a sectional view like FIG. 12, but of another alternate exemplary circuit board with a socket suitable to receive a semiconductor chip device and with a socket housing support structure and an alternate exemplary socket cover support structure.

The skilled artisan will appreciate that it may be possible to combine support structures on both a socket housing and a socket cover on a circuit board 1210. For example, and as shown in FIG. 12, which is a sectional view like FIG. 9, an alternate exemplary socket 1215 may include a support structure 1287 configured like the aforementioned support structure 1187 in the socket housing 1235 well as a support structure 1290 configured like the support structure 90 depicted in FIGS. 1 and 2 (or any disclosed alternatives) and described elsewhere herein.

In still another alternate exemplary embodiment, a circuit board 1310 may include a socket 1315 that has both a support structure 1387 projecting from the socket housing 1335 as well as a support structure 1397 projecting downwardly from the socket cover 1345. In this way, extra support is provided to restrain a downward warpage of the socket cover 1345 and to provide a relatively planar bearing surface in the event that the socket housing 1335 undergoes an upward warpage following reflow of the solder balls 1396.

Figure 14:
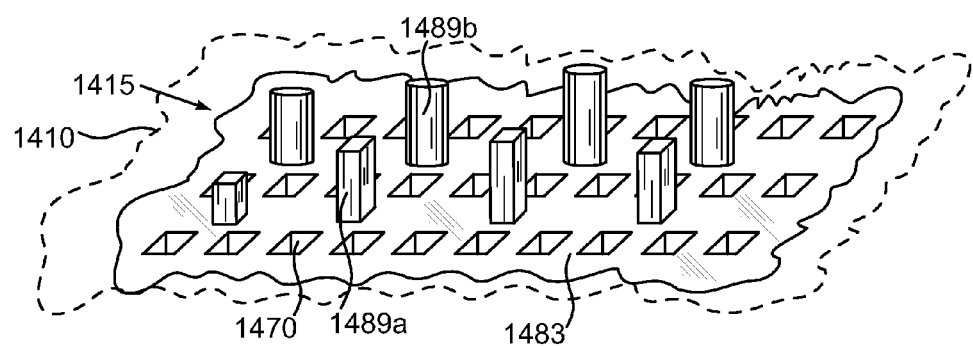
FIG. 14 is a pictorial view of another alternate exemplary circuit board with a socket suitable to receive a semiconductor chip device and with alternative socket housing support structures.

As noted elsewhere herein, a variety of different types of structures may be used for socket supporting structures. In the foregoing illustrative embodiments, plural nested frames are one disclosed alternative. However, other than nested frames may be used for either socket cover or socket housing or both. In this regard, attention is now turned to FIG. 14, which is a pictorial view of a small portion of a circuit board 1410, shown only in dashed for simplicity of illustration, and a small portion of an alternate exemplary socket 1415. In particular, a small portion of the upper surface 1483 of the socket 1415 is depicted, which corresponds structurally to, for example, the surface 783 of the socket 715 as disclosed in FIG. 7. Thus, a few of the cavities 1470 that lead to underlying conductor structures (not visible) are illustrated. Here, in lieu of nested frames for support, plural upwardly projecting members may be used. Two of the members are labeled 1489a and 1489b. The members 1489a may have a generally rectangular footprint and the members 1489b may have a generally circular footprint. However, some or all of the structures 1489a and 1489b may be rectangular or circular as desired. Of course, other footprints are possible. In addition, the members 1489a and 1489b may have stratified heights as shown to provide the same type of relatively planar post-warpage support surface for a socket cover (not visible) as described generally elsewhere herein for the other disclosed embodiments. The support members 1489a and 1489b may be composed of the same materials used to fabricate the surface 1483 or be separately fabricated of the same or other materials and thereafter secured to the surface 1483 by adhesives or other fastening techniques.

Figure 15:
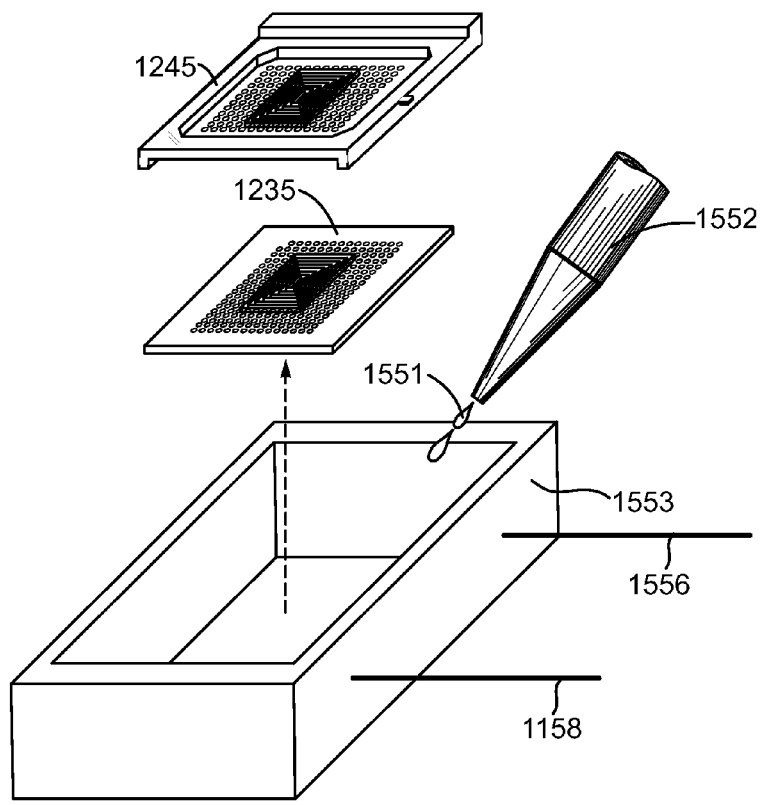
FIG. 15 is a schematic depiction of an exemplary molding process that may be used to fabricate any of the disclosed sockets.

A variety of techniques may be used to manufacture the socket housing and socket cover for any of the disclosed embodiments. An example using the socket housing 1235 and socket cover 1245 depicted in FIG. 12 may be understood by referring now to FIG. 15. A suitable mold 1551 may be injected with a moldable material 1552 by way of an applicator 1551 or by way of supply and return lines 1556 and 1558 in order to create, for example, the socket housing 1235 and the socket cover 1245. Discrete molding processes may be used for each. The molding process may be thermoplastic, thermosetting or some other process. Vacuum conditions may be desirable to enhance structural uniformity. Optionally, machining or other well-known material shaping techniques could be used.

Figure 16:
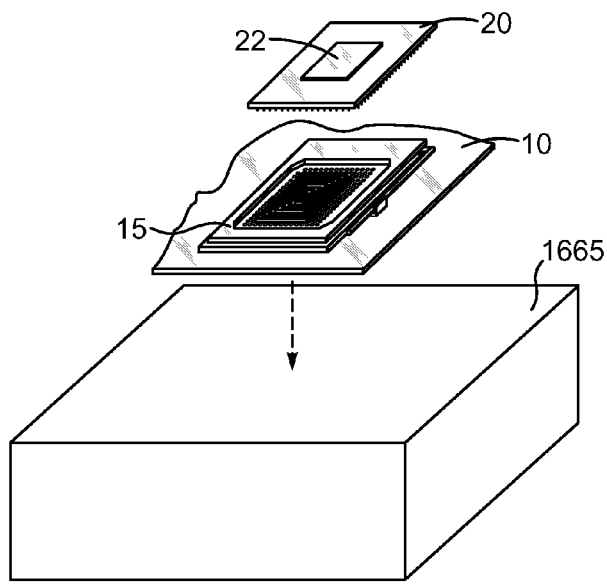
FIG. 16 is an exploded pictorial view of an exemplary circuit board mounted to an electronic device.
Figure 17:
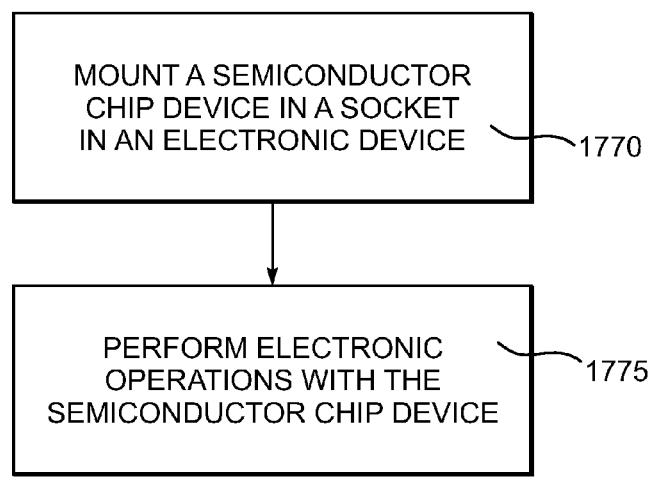
FIG. 17 is a flow chart depicting exemplary steps of using an exemplary socket and semiconductor chip device to perform electronic operations.

Any of the disclosed embodiments of a circuit board, such as circuit boards 10, 710, 1110, 1210, 1310 or 1410, may be coupled to an electronic device. FIG. 16 depicts a pictorial view of the circuit board 10 with the socket 15, the semiconductor chip device 20 and semiconductor chip 22 inserted into a schematically represented electronic device 1665. Here, the electronic device 1665 may be a computer, a server, a hand held device, or virtually any other electronic component. The circuit board 10 may be fitted in the electronic device 1665 and secured thereto by screws, rivets, clamps, adhesives or any other available fastening method. The semiconductor chip device 20 may be seated therein as disclosed generally herein. As shown in FIG. 17, at step 1770 the semiconductor chip device 20 may be mounted to the socket 15 in an electronic device. At step 1775, electronic operations may be performed by the semiconductor chip device 20 and the semiconductor chip 22. The electronic operations may be virtually any operations performed by integrated circuits.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of mounting a circuit board, comprising:
placing the circuit board in a socket, the socket including a socket cover coupled to a socket housing, the socket housing having a first surface with plural cavities and a first support structure projecting away from the first surface and adapted to support a portion of the socket cover, the first support structure including a first plurality of nested frames; and
securing the circuit board to the socket.

2. The method of claim 1, wherein the socket cover includes a second surface for seating a first portion of a circuit board and a second support structure projecting away from the second surface and adapted to support the circuit board.

3. The method of claim 2, wherein the socket cover includes a third surface facing the first surface of the socket housing, the third surface having a third support structure projecting away from the third surface and adapted to support the socket cover.

4. The method of claim 2, wherein the second support structure comprises a first plurality of nested frames.

5. The method of claim 1, wherein the socket cover includes a second surface facing the first surface of the socket housing and second support structure projecting away from the second surface and adapted to support the circuit board.

6. The method of claim 1, wherein the socket is coupled to another circuit board.

7. The method of claim 1, wherein the socket cover comprises a floor with plural socket holes and the circuit board comprises plural conductor pins to penetrate at least some of the socket holes.

8. The method of claim 1, wherein the socket cover is slidably coupled to the socket housing, the step of securing the circuit board comprising sliding the socket cover relative to the socket housing.

9. The method of claim 1, wherein the socket includes a second support structure projecting away from the first surface and laterally separated from the first support structure.

10. A method of manufacturing, comprising:
forming a socket operable to receive a circuit board, the socket including a socket cover coupled to a socket housing, the socket housing having a first surface with plural cavities and a first support structure projecting away from the first surface and adapted to support a portion of the socket cover, the first support structure including a first plurality of nested frames.

11. The method of claim 10, wherein the socket cover includes a second surface for seating a first portion of a circuit board and a second support structure projecting away from the second surface and adapted to support the circuit board.

12. The method of claim 11, wherein the socket cover includes a third surface facing the first surface of the socket housing, the third surface having a third support structure projecting away from the third surface and adapted to support the socket cover.

13. The method of claim 11, wherein the second support structure comprises a first plurality of nested frames.

14. The method of claim 10, wherein the socket cover includes a second surface facing the first surface of the socket housing and second support structure projecting away from the second surface and adapted to support the circuit board.

15. The method of claim 10, comprising coupling the socket to another circuit board.

16. The method of claim 10, wherein the forming the socket comprises forming a socket housing and a socket cover slidedly mounted on the socket housing.

17. The method of claim 10, wherein the socket cover comprises a floor with plural socket holes operable to receive corresponding plural conductor pins of the circuit board.

* * * * *